(12) United States Patent
Lim

(10) Patent No.: US 12,026,399 B2
(45) Date of Patent: *Jul. 2, 2024

(54) SEMICONDUCTOR APPARATUS INCLUDING A PLURALITY OF DIES OPERATING AS A PLURALITY OF CHANNELS

(71) Applicant: SK hynix Inc., Icheon-si (KR)

(72) Inventor: Soo Bin Lim, Suwon-si (KR)

(73) Assignee: SK hynix inc., Icheon-si (KR)

( * ) Notice: Subject to any disclaimer, the term of this patent is extended or adjusted under 35 U.S.C. 154(b) by 517 days.

This patent is subject to a terminal disclaimer.

(21) Appl. No.: 17/201,767

(22) Filed: Mar. 15, 2021

(65) Prior Publication Data

US 2021/0200479 A1 Jul. 1, 2021

Related U.S. Application Data

(63) Continuation of application No. 16/215,292, filed on Dec. 10, 2018, now Pat. No. 10,969,998.

(30) Foreign Application Priority Data

Jul. 13, 2018 (KR) ........................ 10-2018-0081446

(51) Int. Cl.
*G06F 3/06* (2006.01)
*G06F 11/10* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC .... G06F 3/0659; G06F 3/0604; G06F 3/0673; G06F 11/1068; G06F 11/1048;
(Continued)

(56) References Cited

U.S. PATENT DOCUMENTS 6,975,527 B1 12/2005 Park
7,840,136 B1 11/2010 Cunningham et al.
(Continued)

FOREIGN PATENT DOCUMENTS

CN 1398431 A 2/2003
CN 102184149 A 9/2011
(Continued)

*Primary Examiner* — Stacy Whitmore
(74) *Attorney, Agent, or Firm* — WILLIAM PARK & ASSOCIATES LTD.

(57) ABSTRACT

A semiconductor apparatus includes a substrate, a first die, and a second die. The substrate includes first and second byte pads of a first channel and first and second byte pad of a second channel. First byte pads of the first die are respectively coupled to the first byte pads of the first channel, and second byte pads of the first die are respectively coupled to the second byte pads of the first channel. The second die, as disposed, is rotated by 180° with respect to the first die. First byte pads of the second die are respectively coupled to the second byte pads of the second channel, and second byte pads of the second die are respectively coupled to the first byte pads of the second channel.

11 Claims, 8 Drawing Sheets

(51) Int. Cl.
*G11C 5/02* (2006.01)
*G11C 5/06* (2006.01)
*G11C 29/52* (2006.01)
*H01L 23/00* (2006.01)
*H01L 25/065* (2023.01)

(52) U.S. Cl.
CPC .......... *G06F 11/1068* (2013.01); *G11C 5/025* (2013.01); *G11C 5/06* (2013.01); *G11C 29/52* (2013.01); *H01L 24/06* (2013.01); *H01L 25/0655* (2013.01); *H01L 2224/06181* (2013.01); *H01L 2924/1434* (2013.01)

(58) Field of Classification Search
CPC ........... G11C 5/025; G11C 5/06; G11C 29/52; G11C 7/22; G11C 29/24; G11C 29/32; G11C 7/1006; G11C 5/063; G11C 8/12; G11C 8/18; H01L 24/06; H01L 25/0655; H01L 2224/06181; H01L 2924/1434; H01L 25/04; H01L 25/0657
See application file for complete search history.

(56) References Cited

U.S. PATENT DOCUMENTS

| | | | |
|---|---|---|---|
| 9,620,483 B2* | 4/2017 | Yoon | H01L 25/0657 |
| 9,947,378 B2* | 4/2018 | Lee | G11C 29/021 |
| 2003/0214344 A1 | 11/2003 | Suwa et al. | |
| 2006/0248419 A1 | 11/2006 | Colunga et al. | |
| 2011/0208906 A1 | 8/2011 | Gillingham | |
| 2012/0272112 A1 | 10/2012 | Oh et al. | |
| 2013/0001790 A1 | 1/2013 | Kumar et al. | |
| 2013/0315004 A1 | 11/2013 | Chu et al. | |
| 2015/0145122 A1* | 5/2015 | Koog | H01L 23/495 257/737 |
| 2016/0012865 A1* | 1/2016 | Lee | G11C 5/04 365/51 |
| 2016/0056130 A1* | 2/2016 | Yoon | H01L 24/05 257/532 |
| 2016/0181214 A1* | 6/2016 | Oh | H10N 69/00 257/777 |
| 2018/0033470 A1* | 2/2018 | Lee | H03K 19/0005 |
| 2019/0157253 A1* | 5/2019 | Browning | G11C 5/04 |
| 2022/0359364 A1* | 11/2022 | Chang | H01L 24/16 |

FOREIGN PATENT DOCUMENTS

| | | |
|---|---|---|
| CN | 102565137 A | 7/2012 |
| CN | 104346281 A | 2/2015 |
| CN | 105226034 A | 1/2016 |
| CN | 105683936 A | 6/2016 |
| CN | 106409852 A | 2/2017 |
| CN | 106815177 A | 6/2017 |
| CN | 107799135 A | 3/2018 |
| JP | 2011166147 A | 8/2011 |
| JP | 2017092491 A | 5/2017 |
| KR | 1020160006867 A | 1/2016 |
| KR | 1020170050686 A | 5/2017 |
| WO | 2016195264 A1 | 12/2016 |

\* cited by examiner

SEMICONDUCTOR APPARATUS INCLUDING A PLURALITY OF DIES OPERATING AS A PLURALITY OF CHANNELS

CROSS-REFERENCES TO RELATED APPLICATION

The present application is a continuation application of U.S. Ser. No. 16/215,292, filed on Dec. 10, 2018, and claims priority under U.S.C. § 119(a) to Korean application number 10-2018-0081446, filed on Jul. 13, 2018, in the Korean Intellectual Property Office, which is incorporated herein by reference in its entirety as set forth in full.

BACKGROUND

1. Technical Field

Various embodiments of the present disclosure relate to an integrated circuit technology and, more particularly, to a semiconductor apparatus.

2. Related Art

A semiconductor die is manufactured on a wafer and diced dies are mounted on a package substrate and packaged thereby being manufactured as a semiconductor apparatus. The substrate has a substrate pad to be coupled to the die and the die has a die pad to be coupled to the substrate pad. A particular substrate pad is disposed on a predetermined location of the substrate and a particular die pad is disposed on a predetermined location of the die.

A plurality of dies representing a plurality of channels can be packaged into a single package for improvement of storage capacity and data processing speed of a semiconductor apparatus. However, a plurality of dies, which are manufactured according to the same design, cannot be stacked as manufactured. This is because arrangement and order of the substrate pads of the package substrate do not match with arrangement and order of the die pads of the semiconductor die. Therefore, in order to package a plurality of dies into a single package, the design and manufacture of the respective dies should be differentiated from one another. This may serve as a drawback in view of yield and cost of manufacturing a semiconductor apparatus.

SUMMARY

In an embodiment of the present disclosure, a semiconductor apparatus may include a substrate including first byte pads of a first channel, first byte pads of a second channel, second byte pads of the first channel, and second byte pads of the second channel, wherein the first byte pads of the first channel and the first byte pads of the second channel are sequentially disposed on a first side of the substrate, and wherein the second byte pads of the first channel and the second byte pads of the second channel are sequentially disposed on a second side of the substrate opposite the first side of the substrate. The semiconductor apparatus may also include a first die including first byte pads of the first die and second byte pads of the first die, wherein the first byte pads of the first die are sequentially disposed on a first side of the first die and the second byte pads of the first die are sequentially disposed on a second side of the first die opposite the first side of the first die, and wherein the first byte pads of the first die are respectively coupled to the first byte pads of the first channel and the second byte pads of the first die are respectively coupled to the second byte pads of the first channel. The semiconductor apparatus may further include a second die including first byte pads of the second die and second byte pads of the second die, wherein the second die, as disposed, is rotated by substantially 180 degrees with respect to the first die, wherein the first byte pads of the second die are sequentially disposed on a first side of the second die and the second byte pads of the second die are sequentially disposed on a second side of the second die opposite the first side of the second die, and wherein the first byte pads of the second die are respectively coupled to the second byte pads of the second channel and the second byte pads of the second die are respectively coupled to the first byte pads of the second channel.

In an embodiment of the present disclosure, a semiconductor apparatus may include a substrate, a first die, and a second die. The substrate may include first byte pads of a first channel, second byte pads of the first channel, first byte pads of a second channel, and second byte pads of the second channel. The first die may be disposed on the substrate. The second die may be disposed on the substrate, wherein the second die as disposed on the substrate is rotated by substantially 180 degrees with respect to the first die as disposed on the substrate. First byte pads of the second die may be respectively coupled to the second byte pads of the second channel and second byte pads of the second die may be respectively coupled to the first byte pads of the second channel. The second die may be configured to store data, which is received through the first byte pads of the second channel, based on a control signal received through the second byte pads of the second channel and configured to store data, which is received through the second byte pads of the second channel, based on a control signal received through the first byte pads of the second channel.

DETAILED DESCRIPTION

A semiconductor apparatus according to the present disclosure is described below with reference to the accompanying drawings through various embodiments.

Figure 1:
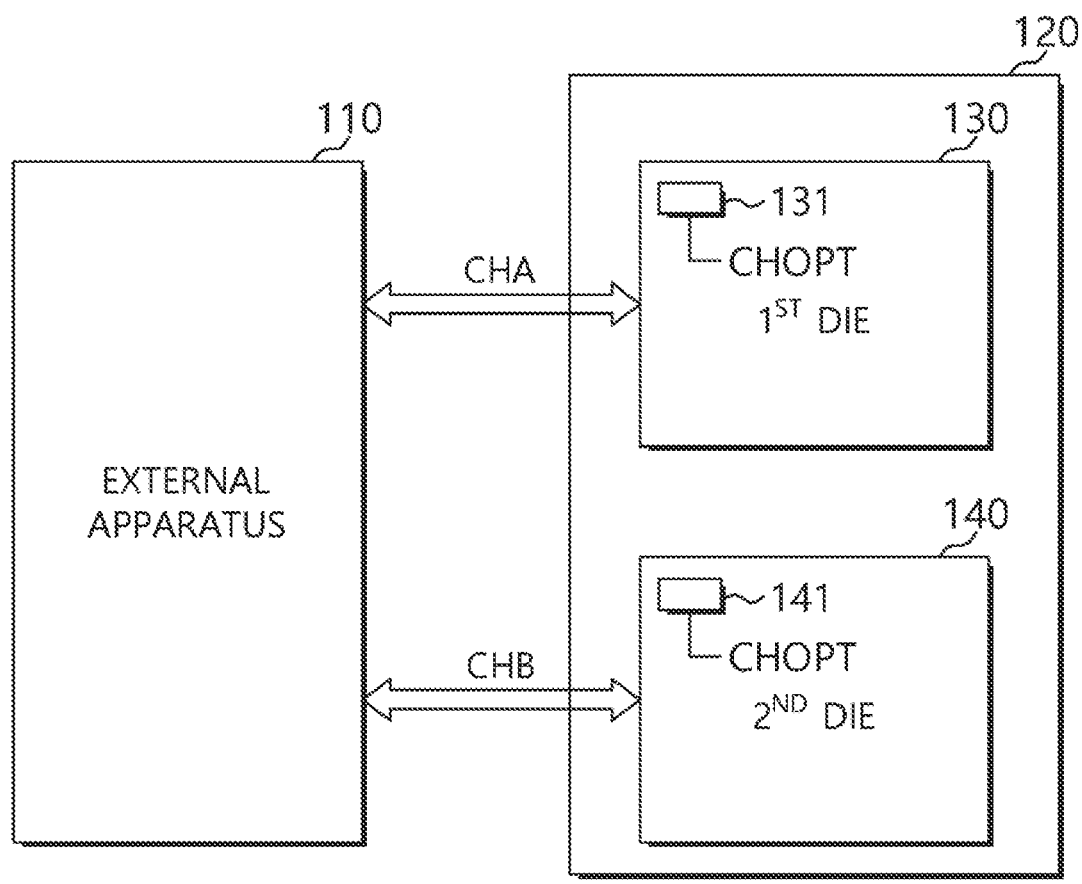
FIG. 1 shows a diagram illustrating a configuration of a semiconductor system, in accordance with an embodiment.

FIG. 1 shows a diagram illustrating a configuration of a semiconductor system 1, in accordance with an embodiment. Referring to FIG. 1, the semiconductor system 1 may include an external apparatus 110 and a semiconductor apparatus 120. The external apparatus 110 may provide various control signals needed for the semiconductor apparatus 120 to operate. The external apparatus 110 may include apparatuses of various kinds. For example, the external apparatus 110 may be a host apparatus, such as a central processing unit (CPU), a graphic processing unit (GPU), a multi-media processor (MMP), a digital signal processor, an application processor (AP), or a memory controller. Also, the external apparatus 110 may be a test apparatus or test equipment configured to test the semiconductor apparatus 120. The semiconductor apparatus 120 may be a memory apparatus, and the memory apparatus may include a volatile memory apparatus and a non-volatile memory apparatus. The volatile memory apparatus may include a static random access memory (static RAM: SRAM), a dynamic RAM (DRAM), or a synchronous DRAM (SDRAM). The non-volatile memory apparatus may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

A plurality of channels may be formed between the external apparatus 110 and the semiconductor apparatus 120. The external apparatus 110 and the semiconductor apparatus 120 may independently perform data input/output operations through the plurality of channels. For example, the plurality of channels may include a first channel and a second channel. The external apparatus 110 may be coupled to the semiconductor apparatus 120 through a first channel bus CHA and a second channel bus CHB. The first channel bus CHA and the second channel bus CHB may be signal transmission paths, links, or channels. Each of the first channel bus CHA and the second channel bus CHB may include a command address bus, a clock bus, the data bus, and so forth. The command address bus and the clock bus may be one-way buses, and the data bus may be a two-way bus. The semiconductor apparatus 120 may be coupled to the first channel bus CHA and the second channel bus CHB and may independently perform a data input/output operation.

The semiconductor apparatus 120 may include a first die 130 and a second die 140. The first die 130 and the second die 140 may be stacked on a single substrate and may be packaged into a single package to form a single semiconductor apparatus. The first die 130 and the second die 140 may be manufactured according to the same design and may have the same configuration. The first die 130 may be coupled to the first channel bus CHA to form a first channel and the second die 140 may be coupled to the second channel bus CHB to form a second channel. The first die 130 may be coupled to the first channel bus CHA to perform a data input/output operation and the second die 140 may be coupled to the second channel bus CHB to perform a data input/output operation. The first die 130 and the second die 140 may include a first channel control circuit 131 and a second channel control circuit 141, respectively. The first channel control circuit 131 may generate a channel option signal CHOPT to indicate that the first die 130 is coupled to the first channel bus CHA and is operating. The second channel control circuit 141 may generate the channel option signal CHOPT to indicate that the second die 140 is coupled to the second channel bus CHB and is operating. In an embodiment, the second die 140, as disposed, may be rotated by 180° with respect to the first die 130. The channel option signal CHOPT may include information on whether the first die 130 and the second die 140 are stacked as rotated. The channel option signal CHOPT output from the first channel control circuit 131 and the channel option signal CHOPT output from the second channel control circuit 141 may have opposite levels from each other. For example, the first channel control circuit 131 is coupled to a first power voltage node and may generate the channel option signal CHOPT having a low level. The second channel control circuit 141 is coupled to a second power voltage node, which has a higher voltage level than the first power voltage node, and may generate the channel option signal CHOPT having a high level.

Figure 2:
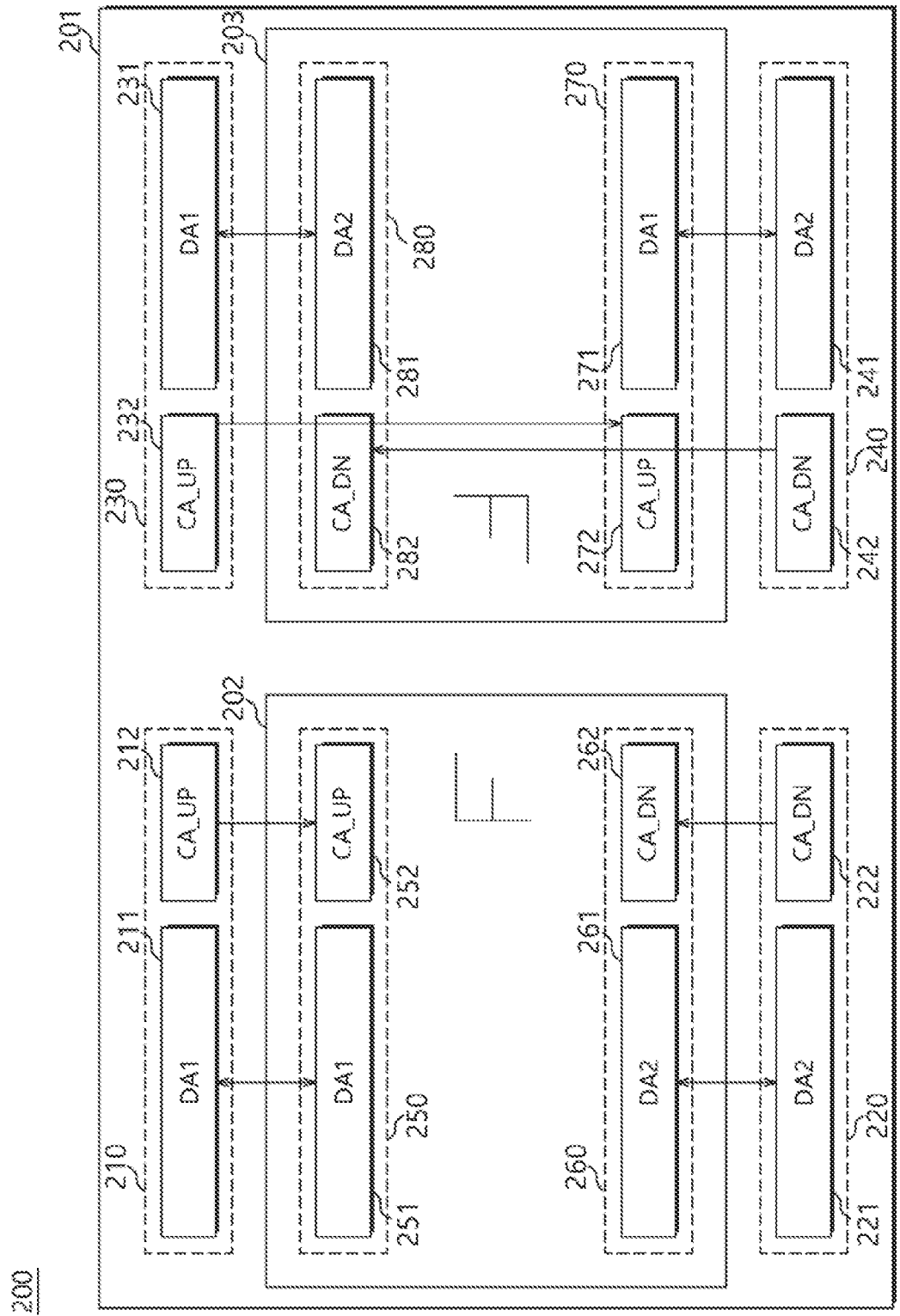
FIG. 2 shows a diagram illustrating a configuration of a semiconductor apparatus, in accordance with an embodiment.

FIG. 2 shows a diagram illustrating a configuration of a semiconductor apparatus 200 in accordance with an embodiment. Referring to FIG. 2, the semiconductor apparatus 200 may include a substrate 201, a first die 202, and a second die 203. The substrate 201 may be a package substrate or a substrate of a single package. The substrate 201 may include a plurality of substrate pads. The substrate 201 may include the plurality of substrate pads for a plurality of corresponding channels, respectively, for the semiconductor apparatus 200 to operate with the plurality of channels. For example, the substrate 201 may include a substrate pad of a first channel and a substrate pad of a second channel. The substrate 201 may include a first byte pad 210 of the first channel, a second byte pad 220 of the first channel, a first byte pad 230 of the second channel, and a second byte pad 240 of the second channel. Each of the first byte pad 210 of the first channel, the first byte pad 230 of the second channel, the second byte pad 220 of the first channel, and the second byte pad 240 of the second channel may include a plurality of pads. Each of the first byte pad 210 of the first channel and the first byte pad 230 of the second channel may be sequentially disposed at one side of the substrate 201. Referring to FIG. 2, the first byte pad 210 of the first channel and the first byte pad 230 of the second channel may be sequentially disposed from left to right at an upper side of the substrate 201. The second byte pad 220 of the first channel and the second byte pad 240 of the second channel may be sequentially disposed at a side opposite to the one side of the substrate 201. Referring to FIG. 2, the second byte pad 220 of the first channel and the second byte pad 240 of the second channel may be sequentially disposed from left to right at a lower side of the substrate 201.

The first byte pad 210 of the first channel may include a first data-related pad (DA1) 211 and a first command address pad (CA_UP) 212. The second byte pad 220 of the first channel may include a second data-related pad (DA2) 221 and a second command address pad (CA_DN) 222. The first byte pad 230 of the second channel may include a first data-related pad (DA1) 231 and a first command address pad (CA_UP) 232. The second byte pad 240 of the second channel may include a second data-related pad (DA2) 241 and a second command address pad (CA_DN) 242. The first data-related pad (DA1) 211, the second data-related pad (DA2) 221, the first data-related pad (DA1) 231, and the second data-related pad (DA2) 241 may be pads configured to transfer data used directly for the data input/output operation and signals related to the data. For example, the error detection code signal, the clock signal, the data bus inversion signal, and so forth may be transferred through the first data-related pad (DA1) 211, the second data-related pad (DA2) 221, the first data-related pad (DA1) 231, and the second data-related pad (DA2) 241. The first command address pad (CA_UP) 212, the second command address pad (CA_DN) 222, the first command address pad (CA_UP) 232, and the second command address pad (CA_DN) 242 may be pad configured to transfer command address signals for controlling the data input/output operation. As illustrated in FIG. 2, the first data-related pad (DA1) 211 and the second data-related pad (DA2) 221 of the first channel and the first data-related pad (DA1) 231 and the second data-related pad (DA2) 241 of the second channel may be disposed outside of the substrate 201. The first command address pad (CA_UP) 212 and the second command address pad (CA_DN) 222 of the first channel and the first command address pad (CA_UP) 232 and the second command address pad (CA_DN) 242 of the second channel may be disposed relatively farther inside of the substrate 201 than the first data-related pad (DA1) 211, the second data-related pad (DA2) 221, the first data-related pad (DA1) 231, and the second data-related pad (DA2) 241. The first command address pad (CA_UP) 212 and the second command address pad (CA_DN) 222 of the first channel and the first command address pad (CA_UP) 232 and the second command address pad (CA_DN) 242 of the second channel may be disposed around the centre of the substrate 201.

The first die 202 and the second die 203 may be manufactured according to the same design and may have the same configuration. The first die 202 and the second die 203 may operate through a plurality of channels. For example, the first die 202 may operate through a first channel and the second die 203 may operate through a second channel. The first die 202 and the second die 203 may stacked on the substrate 201 to configure a single memory apparatus operable through the two channels. The first die 202 may include a first byte pad 250 and a second byte pad 260. The first byte pad 250 may be disposed at one side of the first die 202 and the second byte pad 260 may be disposed at an opposite side of the first die 202. The first byte pad 250 of the first die 202 may include a first data-related pad (DA1) 251 and a first command address pad (CA_UP) 252. The second byte pad 260 of the first die 202 may include a second data-related pad (DA2) 261 and a second command address pad (CA_DN) 262.

The second die 203 may have the same configuration as the first die 202. The second die 203 may include a first byte pad 270 and a second byte pad 280. The first byte pad 270 may be disposed at one side of the second die 203 and the second byte pad 280 may be disposed at a side opposite to the one side of the second die 203. The first byte pad 270 of the second die 203 may include a first data-related pad (DA1) 271 and a first command address pad (CA_UP) 272. The second byte pad 280 of the second die 203 may include a second data-related pad (DA2) 281 and a second command address pad (CA_DN) 282.

It may be difficult to stack or mount the first die 202 and the second die 203 in the same direction due to the arrangement of the byte pads of the substrate 201. As illustrated in FIG. 2, the command address pads of the substrate 201 are crowded in the centre of the substrate 201. Therefore, when the second die 203 is stacked in the same direction as the first die 202, the first command address pad (CA_UP) 232 and the second command address pad (CA_DN) 242 of the second channel are arranged with the first data-related pad (DA1) 271 and the second data-related pad (DA2) 281 of the second die 203 and the first data-related pad (DA1) 231 and the second data-related pad (DA2) 241 of the second channel are arranged with the first command address pad (CA_UP) 272 and the second command address pad (CA_DN) 282 of the second die 203. In this case, it is difficult to form electric connection such as wire bonding between the pads for the same function. Even when the electric connection is formed, it is difficult to precisely transfer signals due to discrepancy between electric paths. In accordance with an embodiment of the present disclosure, the second die 203 may be stacked or mounted on the substrate 201 with a relative rotation of substantially 180° with respect to the first die 202, as indicated by the orientation reference symbol "F." As illustrated in FIG. 2, when the second die 203, as stacked or mounted, is rotated by substantially 180° with respect to the first die 202 on the substrate 201, the first command address pad (CA_UP) 272 of the second die 203 may face the second command address pad (CA_DN) 242 of the second channel, the first data-related pad (DA1) 271 of the second die 203 may face the second data-related pad (DA2) 241 of the second channel, the second command address pad (CA_DN) 282 of the second die 203 may face the first command address pad (CA_UP) 232 of the second channel, and the second data-related pad (DA2) 281 of the second die 203 may face the first data-related pad (DA1) 231 of the second channel.

Referring to FIG. 2, the first data-related pad (DA1) 251 of the first die 202 may be coupled to the first data-related pad (DA1) 211 of the first channel. The first command address pad (CA_UP) 252 of the first die 202 may be coupled to the first command address pad (CA_UP) 212 of the first channel. The second data-related pad (DA2) 261 of the first die 202 may be coupled to the second data-related pad (DA2) 221 of the first channel. The second command address pad (CA_DN) 262 of the first die 202 may be coupled to the second command address pad (CA_DN) 222 of the first channel. The first data-related pad (DA1) 271 of the second die 203 may be coupled to the second data-related pad (DA2) 241 of the second channel. The second data-related pad (DA2) 281 of the second die 203 may be coupled to the first data-related pad (DA1) 231 of the second channel. The first command address pad (CA_UP) 272 of the second die 203 may be coupled to the first command address pad (CA_UP) 232 of the second channel. The second command address pad (CA_DN) 282 of the second die 203 may be coupled to the second command address pad (CA_DN) 242 of the second channel.

Figure 3:
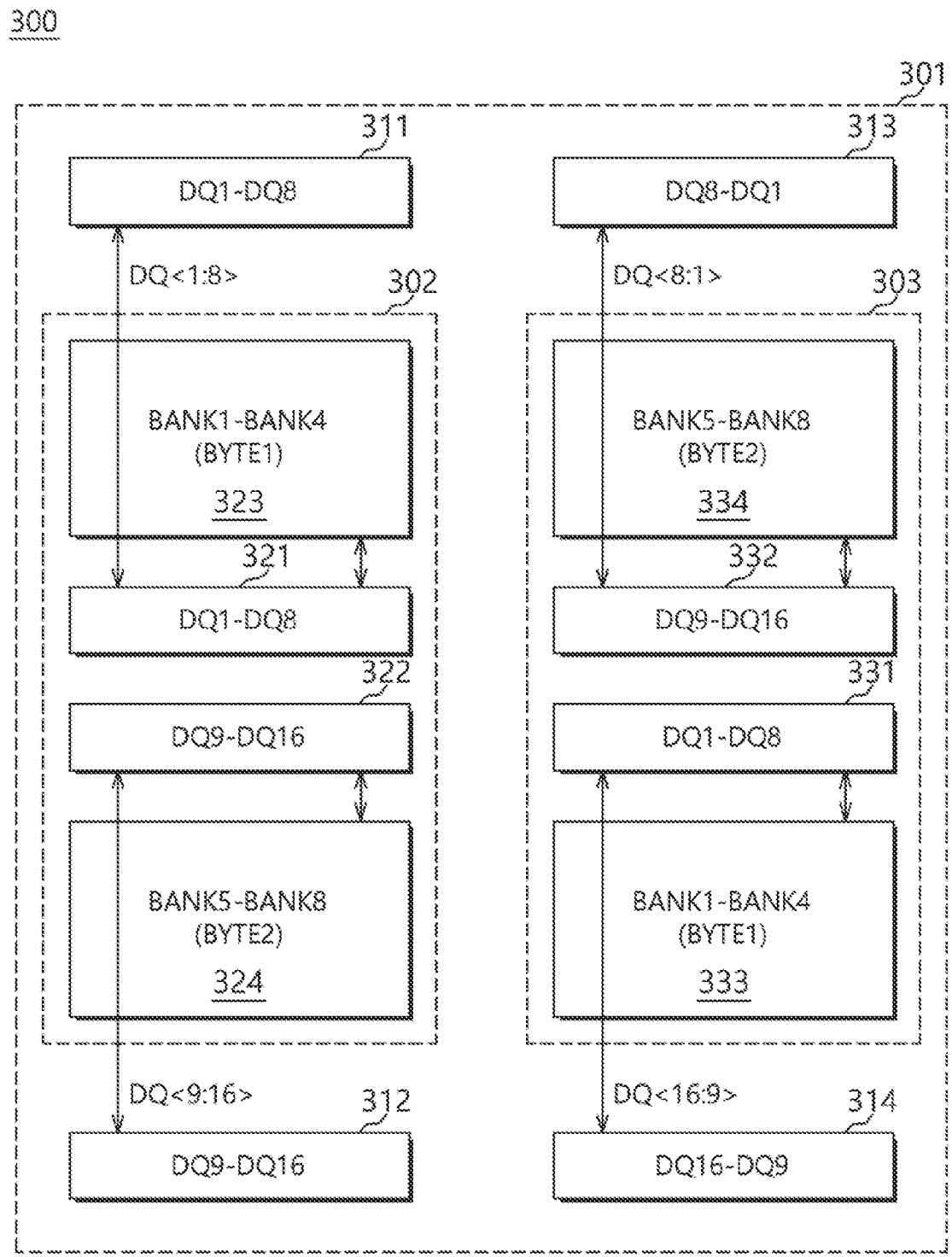
FIG. 3 shows a diagram illustrating at least a partial configuration of a semiconductor apparatus, in accordance with an embodiment.

FIG. 3 shows a diagram illustrating at least a partial configuration of a semiconductor apparatus 300 in accordance with an embodiment. Referring to FIG. 3, the semiconductor apparatus 300 may include a substrate 301, a first die 302, and a second die 303. The semiconductor apparatus 300 may be implemented as the semiconductor apparatus 200 described with reference to FIG. 2. FIG. 3 illustrates data pads (DQ1 to DQ8) 311 among the first data-related pads of the first channel and illustrates data pads (DQ9 to DQ16) 312 among the second data-related pads of the first channel. Also, FIG. 3 illustrates data pads (DQ8 to DQ1) 313 among the first data-related pads of the second channel and illustrates data pads (DQ16 to DQ9) 314 among the second data-related pads of the second channel. Further, FIG. 3 illustrates data pads (DQ1 to DQ8) 321 among the first data-related pads of the first die 302 and illustrates data pads (DQ9 to DQ16) 322 among the second data-related pads of the first die 302. Also, FIG. 3 illustrates data pads (DQ8 to DQ1) 331 among the first data-related pads of the second die 303 and illustrates data pads (DQ16 to DQ9) 332 among the second data-related pads of the second die 303. As described above, the data pads (DQ1 to DQ8) 321 of the first die 302 may be coupled to the data pads (DQ1 to DQ8) 311 of the first channel and the data pads (DQ9 to DQ16)

322 of the first die 302 may be coupled to the data pads (DQ9 to DQ16) 312 of the first channel. The data pads (DQ8 to DQ1) 331 of the second die 303 may be coupled to the data pads (DQ16 to DQ9) 314 of the second channel and the data pads (DQ16 to DQ9) 332 of the second die 303 may be coupled to the data pads (DQ8 to DQ1) 313 of the second channel. Each of the above-described data pads may have 8 pads to transfer 8 pieces of data. This, however, does not limit the scope of the present disclosure. Other embodiments may include different numbers of pads to transfer more or less pieces of data.

Referring to FIG. 3, the first die 302 may include a first byte memory bank 323 and a second byte memory bank 324. Each of the first byte memory bank 323 and the second byte memory bank 324 may include a plurality of memory banks. For example, each of the first byte memory bank 323 and the second byte memory bank 324 may include 4 memory banks. The first byte memory bank 323 may include first to fourth memory banks BANK1 to BANK4, and the second byte memory bank 324 may include fifth to eighth memory banks BANK5 to BANK8. The first byte memory bank 323 may be coupled to the data pads (DQ1 to DQ8) 321 and may store therein data provided through the data pads (DQ1 to DQ8) 311 and the data pads (DQ1 to DQ8) 321. Data may be output from the first byte memory bank 323 to the data pads (DQ1 to DQ8) 311 through the data pads (DQ1 to DQ8) 321. The second byte memory bank 324 may be coupled to the data pads (DQ9 to DQ16) 322 and may store therein data provided through the data pads (DQ9 to DQ16) 312 and the data pads (DQ9 to DQ16) 322. Data may be output from the second byte memory bank 324 to the data pads (DQ9 to DQ16) 312 through the data pads (DQ9 to DQ16) 322. First to eighth data DQ<1:8> provided through the data pads (DQ1 to DQ8) 311 of the first channel may be transferred to the first byte memory bank 323 through the data pads (DQ1 to DQ8) 321 of the first die 302 and may be stored into the first byte memory bank 323. Data output from the first byte memory bank 323 may be transferred, as the first to eighth data DQ<1:8>, to the data pads (DQ1 to DQ8) 311 of the first channel through the data pads (DQ1 to DQ8) 321 of the first die 302. Ninth to sixteenth data DQ<9:16> provided through the data pads (DQ9 to DQ16) 312 of the first channel may be transferred to the second byte memory bank 324 through the data pads (DQ9 to DQ16) 322 of the first die 302 and may be stored into the second byte memory bank 324. Data output from the second byte memory bank 324 may be output, as the ninth to sixteenth data DQ<9:16>, to the data pads (DQ9 to DQ16) 312 of the first channel through the data pads (DQ9 to DQ16) 322 of the first die 302.

The second die 303 may include a first byte memory bank 333 and a second byte memory bank 334. The first byte memory bank 333 may include first to fourth memory banks BANK1 to BANK4, and the second byte memory bank 334 may include fifth to eighth memory banks BANK5 to BANK8. The first byte memory bank 333 may be coupled to the data pads (DQ8 to DQ1) 331 and may store therein data provided through the data pads (DQ16 to DQ9) 314. Data may be output from the first byte memory bank 333 to the data pads (DQ16 to DQ9) 314 through the data pads (DQ8 to DQ1) 331. The second byte memory bank 334 may be coupled to the data pads (DQ16 to DQ9) 332 and may store therein data provided through the data pads (DQ8 to DQ1) 313. Data may be output from the second byte memory bank 334 to the data pads (DQ8 to DQ1) 313 through the data pads (DQ16 to DQ9) 332. First to eighth data DQ<8:1> provided through the data pads (DQ8 to DQ1) 313 of the second channel may be transferred to the second byte memory bank 334 through the data pads (DQ16 to DQ9) 332 of the second die 303 and may be stored into the second byte memory bank 334. Data output from the second byte memory bank 334 may be transferred, as the first to eighth data DQ<8:1>, to the data pads (DQ8 to DQ1) 313 of the second channel through the data pads (DQ16 to DQ9) 332 of the second die 303. Ninth to sixteenth data DQ<16:9> provided through the data pads (DQ16 to DQ9) 314 of the second channel may be transferred to the first byte memory bank 333 through the data pads (DQ8 to DQ1) 331 of the second die 303 and may be stored into the first byte memory bank 333. Data output from the first byte memory bank 333 may be output, as the ninth to sixteenth data DQ<16:9>, to the data pads (DQ16 to DQ9) 314 of the second channel through the data pads (DQ8 to DQ1) 331 of the second die 303.

The second die 303 may receive the first to eighth data DQ<8:1>, which is provided through the data pads (DQ8 to DQ1) 313 of the second channel, as the ninth to sixteenth data through the data pads (DQ16 to DQ9) 332 and may store the ninth to sixteenth data into the second byte memory bank 334. The second die 303 output data, which is output from the second byte memory bank 334, as the first to eighth data DQ<8:1> to the data pads (DQ8 to DQ1) 313 of the second channel. The second die 303 may receive the ninth to sixteenth data DQ<16:9>, which is provided through the data pads (DQ16 to DQ9) 314 of the second channel, as the first to eighth data through the data pads (DQ8 to DQ1) 331 and may store the first to eighth data into the first byte memory bank 333. The second die 303 output data, which is output from the first byte memory bank 333, as the ninth to sixteenth data DQ<16:9> to the data pads (DQ16 to DQ9) 314 of the second channel. Therefore, the sequence of data provided through the data pads (DQ8 to DQ1) 313 and the data pads (DQ16 to DQ9) 314 of the second channel may be opposite to the sequence of data received by and stored in the second die 203.

Figure 4:
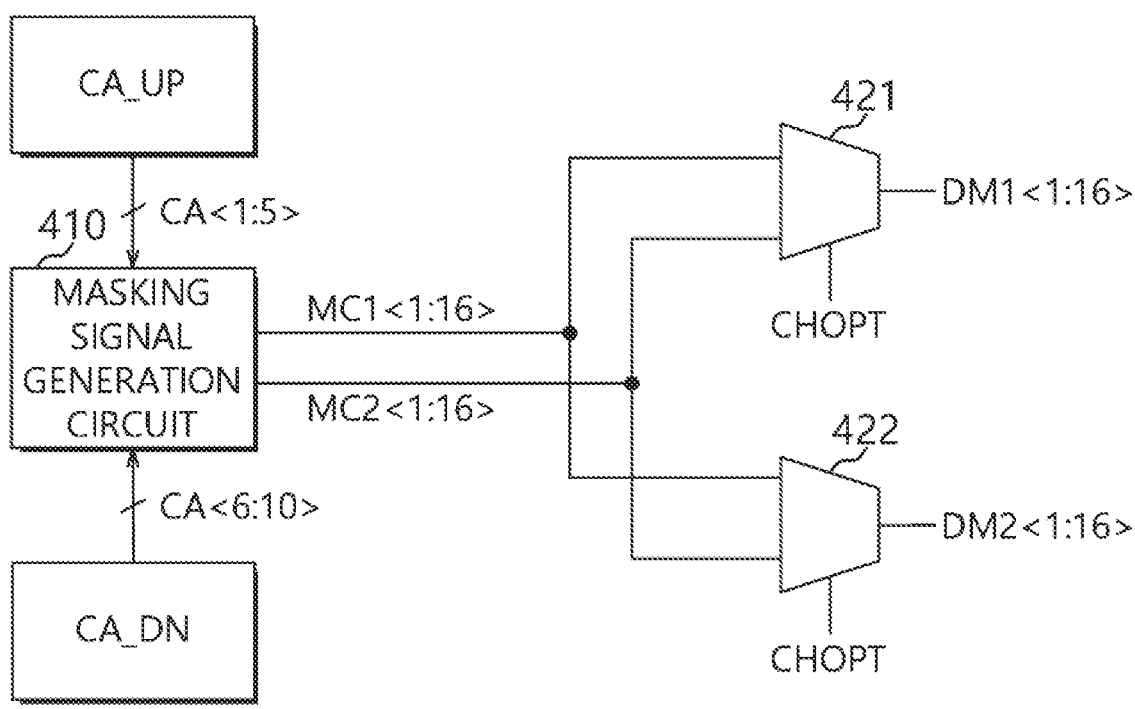
FIG. 4 shows a diagram illustrating a configuration of a data masking circuit, in accordance with an embodiment.

FIG. 4 shows a diagram illustrating a configuration of a data masking circuit 400, in accordance with an embodiment. Referring to FIGS. 2 and 4, each of the first die 202 and the second die 203 may include the data masking circuit 400. The data masking circuit 400 may mask a particular piece of data among data provided by the external apparatus 110 such that the particular piece of data is not stored in the semiconductor apparatus 200. The data masking circuit 400 may generate at least two masking control signals based on command address signals CA<1:5> and CA<6:10> and may generate a data masking signal by selecting one among the at least two masking control signals based on the channel option signal CHOPT. The command address signals CA<1:5> may be provided through first command address pads CA_UP, and the command address signals CA<6:10> may be provided through second command address pads CA_DN. Referring to FIG. 4, the data masking circuit 400 may include a masking signal generation circuit 410, a first selector 421, and a second selector 422. The masking signal generation circuit 410 may be coupled to the first command address pads CA_UP and the second command address pads CA_DN and may receive the command address signals CA<1:5> and CA<6:10>. The masking signal generation circuit 410 may generate first masking control signals MC1<1:16> and second masking control signals MC2<1:16> based on the command address signals CA<1:5> and CA<6:10>. The command address signals CA<1:5> and CA<6:10> may be of ten bits and the masking control signals MC1<1:16> and second masking control signals MC2<1:16> may be respectively of 16 bits. This, however, does not limit the scope of the present disclosure. Other embodiments may include command address signals and masking control signals having different number of bits.

The first selector 421 may receive the first masking control signals MC1<1:16>, the second masking control signals MC2<1:16>, and the channel option signal CHOPT. The first selector 421 may select and output, as first data masking signals DM1<1:16>, one of the first masking control signals MC1<1:16> and the second masking control signals MC2<1:16> based on the channel option signal CHOPT. The second selector 422 may receive the first masking control signals MC1<1:16>, the second masking control signals MC2<1:16>, and the channel option signal CHOPT. The second selector 422 may select and output, as second data masking signals DM2<1:16>, the other one of the first masking control signals MC1<1:16> and the second masking control signals MC2<1:16> based on the channel option signal CHOPT.

As illustrated in FIG. 3, the data pads (DQ8 to DQ1) 331 of the second die 203 may be coupled to the data pads (DQ16 to DQ9) 314 of the second channel, and the data pads (DQ16 to DQ9) 332 of the second die 203 may be coupled to the data pads (DQ8 to DQ1) 313 of the second channel. Therefore, the sequence of data received by the data pads (DQ8 to DQ1) 313 and the data pads (DQ16 to DQ9) 314 of the second channel may be different from the sequence of data received by the second die 203. When the first to eighth data DQ<8:1> needs to be data-masked, the second die 203 should mask the data provided not through the data pads (DQ8 to DQ1) 331 but through the data pads (DQ16 to DQ9) 332. The data masking circuit 400 may control intended data-masking on intended data by selecting and outputting, as the first data masking signals DM1<1:16> and the second data masking signals DM2<1:16>, one of the first masking control signals MC1<1:16> and the second masking control signals MC2<1:16> based on the channel option signal CHOPT.

For example, the data masking circuit 400 included in the first die 302 may receive the channel option signal CHOPT having a low level. Based on the channel option signal CHOPT, the data masking circuit 400 may output the first masking control signals MC1<1:16> as the first data masking signals DM1<1:16> and may output the second masking control signals MC2<1:16> as the second data masking signals DM2<1:16>. For example, the data masking circuit 400 included in the second die 203 may receive the channel option signal CHOPT having a high level. Based on the channel option signal CHOPT, the data masking circuit 400 may output the second masking control signals MC2<1:16> as the first data masking signals DM1<1:16> and may output the first masking control signals MC1<1:16> as the second data masking signals DM2<1:16>. Therefore, when all or partial pieces of the first to eighth data DQ<8:1> need to be data-masked, the data masking circuit 400 may control all or partial pieces of data received by the second die 203 through the data pads (DQ16 to DQ9) 332 to be masked. Further, when all or partial pieces of the ninth to sixteenth data DQ<16:9> need to be data-masked, the data masking circuit 400 may control all or partial pieces of data received by the second die 203 through the data pads (DQ8 to DQ1) 331 to be masked.

Figure 5:
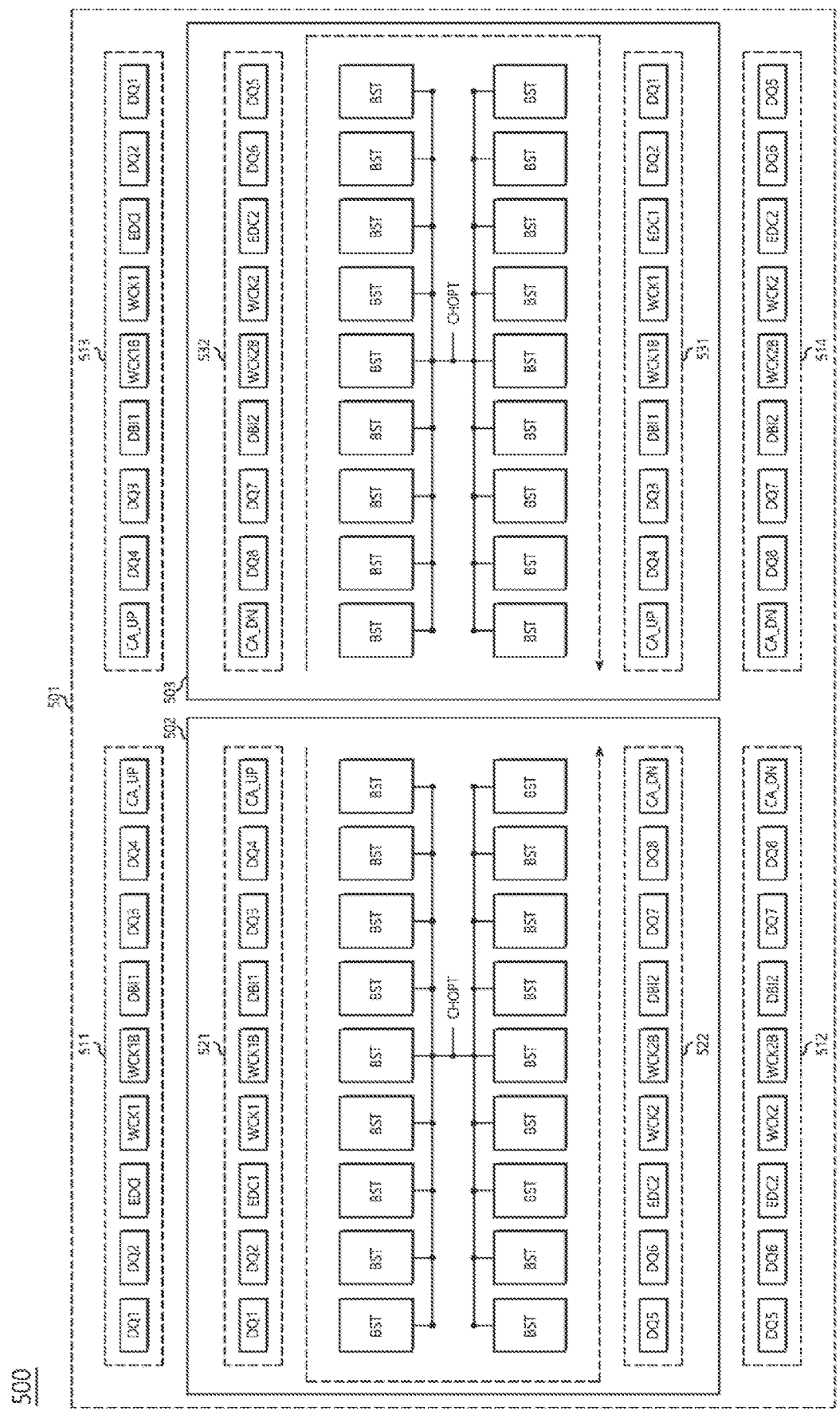
FIG. 5 shows a diagram illustrating at least a partial configuration of a semiconductor apparatus, in accordance with an embodiment.

FIG. 5 shows a diagram illustrating at least a partial configuration of a semiconductor apparatus 500, in accordance with an embodiment. The semiconductor apparatus 500 may include a substrate 501, a first die 502, and a second die 503. The substrate 501 may include first byte pads 511 and second byte pads 512 of a first channel and first byte pads 513 and second byte pads 514 of a second channel. The first die 502 may include first byte pads 521 and second byte pads 522. The second die 503 may include first byte pads 531 and second byte pads 532. The first byte pads 511 of the first channel may include a first data pad DQ1, a second data pad DQ2, a first error detection code (EDC) pad EDC1, a first clock pad WCK1, a second clock pad WCK1B, a first data bus inversion (DBI) pad DBI1, a third data pad DQ3, a fourth data pad DQ4, and a first command address pad CA_UP, which are sequentially disposed from the outside to the inside of the substrate 501 at one side of the substrate 501. The first data pad DQ1, the second pad DQ2, the first EDC pad EDC1, the first clock pad WCK1, the second clock pad WCK1B, the first DBI pad DBI1, the third data pad DQ3, and the fourth data pad DQ4 may be the data-related pads. The second byte pads 512 of the first channel may include a fifth data pad DQ5, a sixth data pad DQ6, a second EDC pad EDC2, a third clock pad WCK2, a fourth clock pad WCK2B, a second DBI pad DBI2, a seventh data pad DQ7, an eighth data pad DQ8, and a second command address pad CA_DN, which are sequentially disposed from the outside to the inside of the substrate 501 at the other side of the substrate 501. The fifth data pad DQ5, the sixth data pad DQ6, the second EDC pad EDC2, the third clock pad WCK2, the fourth clock pad WCK2B, the second DBI pad DBI2, the seventh data pad DQ7, and the eighth data pad DQ8 may be the data-related pads.

The first byte pads 513 of the second channel may include a first data pad DQ1, a second data pad DQ2, a first error detection code (EDC) pad EDC1, a first clock pad WCK1, a second clock pad WCK1B, a first data bus inversion (DBI) pad DBI1, a third data pad DQ3, a fourth data pad DQ4, and a first command address pad CA_UP, which are sequentially disposed from the outside to the inside of the substrate 501 at one side of the substrate 501. The first data pad DQ1, the second pad DQ2, the first EDC pad EDC1, the first clock pad WCK1, the second clock pad WCK1B, the first DBI pad DBI1, the third data pad DQ3, and the fourth data pad DQ4 may be the data-related pads. The second byte pads 514 of the second channel may include a fifth data pad DQ5, a sixth data pad DQ6, a second EDC pad EDC2, a third clock pad WCK2, a fourth clock pad WCK2B, a second DBI pad DBI2, a seventh data pad DQ7, an eighth data pad DQ8, and a second command address pad CA_DN, which are sequentially disposed from the outside to the inside of the substrate 501 at the other side of the substrate 501. The fifth data pad DQ5, the sixth data pad DQ6, the second EDC pad EDC2, the third clock pad WCK2, the fourth clock pad WCK2B, the second DBI pad DBI2, the seventh data pad DQ7, and the eighth data pad DQ8 may be the data-related pads.

The first byte pads 521 of the first die 502 may include a first data pad DQ1, a second data pad DQ2, a first EDC pad EDC1, a first clock pad WCK1, a second clock pad WCK1B, a first DBI pad DBI1, a third data pad DQ3, a fourth data pad DQ4, and a first command address pad CA_UP, which are sequentially disposed at one side of the first die 502. The first data pad DQ1, the second pad DQ2, the first EDC pad EDC1, the first clock pad WCK1, the second clock pad WCK1B, the first DBI pad DBI1, the third data pad DQ3, and the fourth data pad DQ4 may be the data-related pads. The second byte pads 522 of the first die 502 may include a fifth data pad DQ5, a sixth data pad DQ6, a second EDC pad EDC2, a third clock pad WCK2, a fourth clock pad WCK2B, a second DBI pad DBI2, a seventh data pad DQ7, an eighth data pad DQ8, and a second command address pad CA_DN, which are sequentially disposed at the other side of the first die 502. The fifth data pad DQ5, the sixth data pad DQ6, the second EDC pad EDC2, the third clock pad WCK2, the fourth clock pad WCK2B, the second DBI pad DBI2, the seventh data pad DQ7, and the eighth data pad DQ8 may be the data-related pads.

The first byte pads 531 of the second die 503 may include a first data pad DQ1, a second data pad DQ2, a first EDC pad EDC1, a first clock pad WCK1, a second clock pad WCK1B, a first DBI pad DBI1, a third data pad DQ3, a fourth data pad DQ4, and a first command address pad CA_UP, which are sequentially disposed at one side of the second die 503. The first data pad DQ1, the second pad DQ2, the first EDC pad EDC1, the first clock pad WCK1, the second clock pad WCK1B, the first DBI pad DBI1, the third data pad DQ3, and the fourth data pad DQ4 may be the data-related pads. The second byte pads 532 of the second die 503 may include a fifth data pad DQ5, a sixth data pad DQ6, a second EDC pad EDC2, a third clock pad WCK2, a fourth clock pad WCK2B, a second DBI pad DBI2, a seventh data pad DQ7, an eighth data pad DQ8, and a second command address pad CA_DN, which are sequentially disposed at the other side of the second die 503. The fifth data pad DQ5, the sixth data pad DQ6, the second EDC pad EDC2, the third clock pad WCK2, the fourth clock pad WCK2B, the second DBI pad DBI2, the seventh data pad DQ7, and the eighth data pad DQ8 may be the data-related pads. FIG. 5 exemplifies input/output configuration of 8 pieces of data through each of the first channel and the second channel, for convenience of description. However, the number of data pads may vary according to a number of pieces of data. The configuration of the semiconductor apparatus 500 described with reference to FIG. 5 may be implemented as each of the semiconductor apparatuses described with reference to FIGS. 1 to 3.

The first data pad DQ1, the second pad DQ2, the first EDC pad EDC1, the first clock pad WCK1, the second clock pad WCK1B, the first DBI pad DBI1, the third data pad DQ3, the fourth data pad DQ4, and the first command address pad CA_UP of the first die 502 may be coupled to the first data pad DQ1, the second pad DQ2, the first EDC pad EDC1, the first clock pad WCK1, the second clock pad WCK1B, the first DBI pad DBI1, the third data pad DQ3, the fourth data pad DQ4, and the first command address pad CA_UP of the first byte pads 511 of the first channel, respectively. The fifth data pad DQ5, the sixth data pad DQ6, the second EDC pad EDC2, the third clock pad WCK2, the fourth clock pad WCK2B, the second DBI pad DBI2, the seventh data pad DQ7, the eighth data pad DQ8, and the second command address pad CA_DN of the first die 502 may be coupled to the fifth data pad DQ5, the sixth data pad DQ6, the second EDC pad EDC2, the third clock pad WCK2, the fourth clock pad WCK2B, the second DBI pad DBI2, the seventh data pad DQ7, the eighth data pad DQ8, and the second command address pad CA_DN of the second byte pads 512 of the first channel, respectively.

The second die 503, as disposed, may be rotated by substantially 180° with respect to the first die 502 such that the data-related pads and the command address pad of the second die 503 are aligned with the data-related pads and the command address pad of the substrate 501. The first data pad DQ1, the second pad DQ2, the first EDC pad EDC1, the first clock pad WCK1, the second clock pad WCK1B, the first DBI pad DBI1, the third data pad DQ3, the fourth data pad DQ4, and the first command address pad CA_UP of the second die 503 may be coupled to the fifth data pad DQ5, the sixth data pad DQ6, the second EDC pad EDC2, the third clock pad WCK2, the fourth clock pad WCK2B, the second DBI pad DBI2, the seventh data pad DQ7, the eighth data pad DQ8, and the second command address pad CA_DN of the second byte pads 514 of the second channel, respectively. The fifth data pad DQ5, the sixth data pad DQ6, the second EDC pad EDC2, the third clock pad WCK2, the fourth clock pad WCK2B, the second DBI pad DBI2, the seventh data pad DQ7, the eighth data pad DQ8, and the second command address pad CA_DN of the second die 503 may be coupled to the first data pad DQ1, the second pad DQ2, the first EDC pad EDC1, the first clock pad WCK1, the second clock pad WCK1B, the first DBI pad DBI1, the third data pad DQ3, the fourth data pad DQ4, and the first command address pad CA_UP of the first byte pads 513 of the second channel, respectively.

Each of the first die 502 and the second die 503 may include a plurality of boundary scan cells BST coupled in a one-to-one manner to the pads included therein. The plurality of boundary scan cells BST may be disposed to test whether the pads included in the first die 502 and the second die 503 are normally coupled to the pads included in the substrate 501. The test may be the boundary scan test. During the boundary scan test, a test signal is controlled to be inputted to the first command address pad CA_UP, to travel sequentially through the first data-related pads, the second data-related pads and the second command address pad CA_DN and then to be outputted from the second command address pad CA_DN. Therefore, the boundary scan test may be performed in a first direction within the first die 502 and may be performed in a second direction, which is opposite to the first direction, within the second die 503. For example, the first direction may be the counter-clockwise direction and the second direction may be the clockwise direction. Because the second die 503 as stacked is rotated by substantially 180° with respect to the first die 502, the traveling direction of the test signal traveling through the plurality of boundary scan cells BST within the second die 503 should be opposite to the traveling direction of the test signal traveling through the plurality of boundary scan cells BST within the first die 502.

The plurality of boundary scan cells BST may receive the channel option signal CHOPT. Within the first die 502, each of the plurality of boundary scan cells BST may receive a signal provided from a neighboring boundary scan cell BST disposed in the second direction and output the signal to a neighboring boundary scan cell BST disposed in the first direction, in response to the channel option signal CHOPT. Within the second die 503, each of the plurality of boundary scan cells BST may receive a signal provided from a neighboring boundary scan cell BST disposed in the first direction and output the signal to a neighboring boundary scan cell BST disposed in the second direction, in response to the channel option signal CHOPT.

Figure 6:
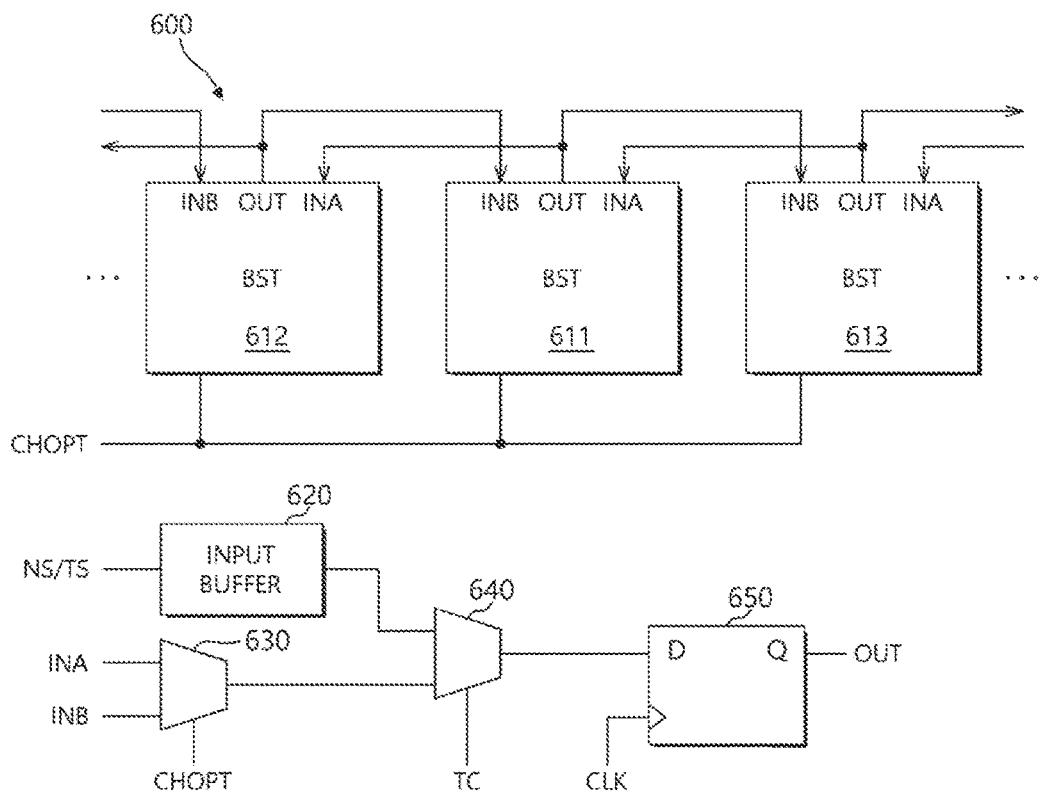
FIG. 6 shows a diagram illustrating configurations of a boundary scan chain and a boundary scan cell, in accordance with an embodiment.

FIG. 6 shows a diagram illustrating configurations of a boundary scan chain 600 and a boundary scan cell BTS, in accordance with an embodiment of the present disclosure. The boundary scan chain 600 described with reference to FIG. 6 may be applied with the connection relationship of the plurality of boundary scan cells BST described with reference to FIG. 5. FIG. 6 exemplifies three boundary scan cells BTS. A first boundary scan cell 611 may be coupled to a second boundary scan cell 612 disposed in the first direction of the first boundary scan cell 611 and may be coupled to a third boundary scan cell 613 disposed in the second direction of the first boundary scan cell 611. Each of the first boundary scan cell 611, the second boundary scan cell 612, and the third boundary scan cell 613 may include a first input node INA, a second input node INB, and an output node OUT. The first boundary scan cell 611, the second boundary scan cell 612, and the third boundary scan cell 613 may commonly receive the channel option signal CHOPT. The first input node INA of the first boundary scan cell 611 may be coupled to the output node OUT of the third boundary scan cell 613, and the second input node INB of the first boundary scan cell 611 may be coupled to the output node OUT of the second boundary scan cell 612. The output node OUT of the first boundary scan cell 611 may be commonly coupled to the first input node INA of the second boundary scan cell 612 and the second input node INB of the third boundary scan cell 613. The second input node INB of the second boundary scan cell 612 may be coupled to the output node OUT of another boundary scan cell BTS disposed in the first direction of the second boundary scan cell 612. The output node OUT of the second boundary scan cell 612 may be commonly coupled to the second input node INB of the first boundary scan cell 611 and the first input node INA of the another boundary scan cell BTS. The first input node INA of the third boundary scan cell 613 may be coupled to the output node OUT of further another boundary scan cell BTS disposed in the second direction of the third boundary scan cell 613. The output node OUT of the third boundary scan cell 613 may be commonly coupled to the first input node INA of the first boundary scan cell 611 and the second input node INB of the further another boundary scan cell BTS.

The first boundary scan cell 611, the second boundary scan cell 612, and the third boundary scan cell 613 may receive, based on the channel option signal CHOPT, through one of the first input node INA and the second input node INB, a signal provided from another boundary scan cell BTS. For example, when the first boundary scan cell 611, the second boundary scan cell 612, and the third boundary scan cell 613 are included in the first die 502, each of the first boundary scan cell 611, the second boundary scan cell 612, and the third boundary scan cell 613 may receive a signal through the first input node INA based on the channel option signal CHOPT. Therefore, a signal inputted to the third boundary scan cell 613 may travel through the first boundary scan cell 611 and may be outputted to the second boundary scan cell 612, and the boundary scan test may be performed in the first direction. For example, when the first boundary scan cell 611, the second boundary scan cell 612, and the third boundary scan cell 613 are included in the second die 503, each of the first boundary scan cell 611, the second boundary scan cell 612, and the third boundary scan cell 613 may receive a signal through the second input node INB based on the channel option signal CHOPT. Therefore, a signal inputted to the second boundary scan cell 612 may travel through the first boundary scan cell 611 and may be outputted to the third boundary scan cell 613, and the boundary scan test may be performed in the second direction.

The plurality of boundary scan cells BST may have the same structure as one another. The boundary scan cell BTS may include an input buffer 620, an input path selector 630, a signal selector 640, and a flipflop 650. The input buffer 620 may receive a normal signal NS and a test signal TS. Referring to FIGS. 5 and 6, the normal signal NS may be a signal inputted during a normal operation of the semiconductor apparatus 500. The normal signal NS may be data when a data pad is coupled to the boundary scan cell BTS. The test signal TS may be a signal inputted during the boundary scan test. The input path selector 630 may be coupled to the first input node INA and the second input node INB and may output, based on the channel option signal CHOPT, one of signals inputted through the first input node INA and the second input node INB. For example, when the channel option signal CHOPT has a low level, the input path selector 630 may output a signal inputted through the first input node INA. When the channel option signal CHOPT has a high level, the input path selector 630 may output a signal inputted through the second input node INB. The signal selector 640 may output one of the output of the input buffer 620 and the output of the input path selector 630 based on a test control signal TC. Within the first die 502, the test signal TS may be inputted to the boundary scan cell BTS coupled to the first command address pad CA_UP and the signal selector 640 of the boundary scan cell BTS may output the test signal TS, provided through the input buffer 620, based on the test control signal TC. Remaining boundary scan cells BTS other than the boundary scan cell BTS coupled to the first command address pad CA_UP may output the output of the input path selector 630 based on the test control signal TC. The flipflop 650 may receive the output of the signal selector 640 and a clock signal CLK. The flipflop 650 may delay the output of the signal selector 640 with synchronized to the clock signal CLK and may output the delayed signal through the output node OUT.

Figure 7:
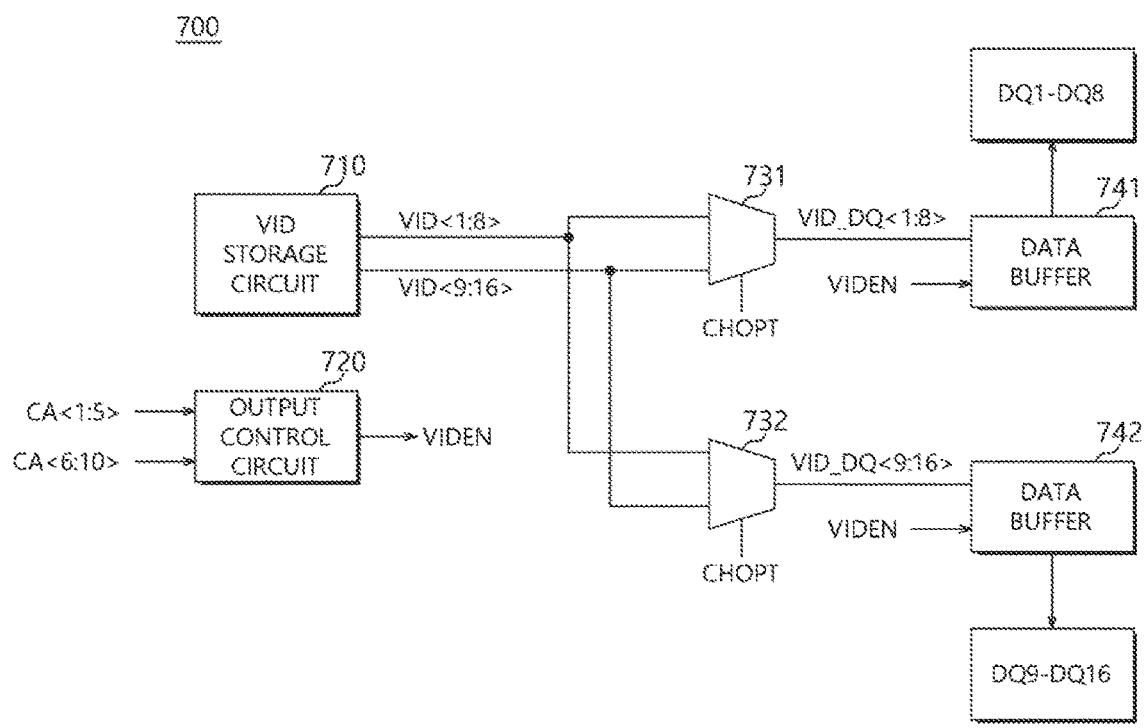
FIG. 7 shows a diagram illustrating a configuration of a vendor ID output circuit, in accordance with an embodiment.

FIG. 7 shows a diagram illustrating a configuration of a vendor ID output circuit 700, in accordance with an embodiment. Each of the first die 202 and the second die 203, which are described with reference to FIG. 2, may include the vendor ID output circuit 700. The vendor ID output circuit 700 may be configured to output unique information, which is stored in each of the first die 202 and the second die 203, to the external apparatus 110. The vendor ID output circuit 700 may include a vender ID (VID) storage circuit 710, an output control circuit 720, a first selector 731, and a second selector 732. The VID storage circuit 710 may be an information storage circuit such as a register, a nonvolatile memory, and so forth. The VID storage circuit 710 may have first vendor ID information VID<1:8> and second vendor ID information VID<9:16>. The first vendor ID information VID<1:8> may be a part of a single piece of vendor ID information and the second vendor ID information VID<9:16> may be another part of the single piece of vendor ID information. The output control circuit 720 may generate an output control signal VIDEN based on command address signals CA<1:5> and CA<6:10>.

The first selector 731 may receive the first vendor ID information VID<1:8>, the second vendor ID information VID<9:16>, and the channel option signal CHOPT. The first selector 731 may output, as a first vendor ID signal VID_DQ<1:8>, one of the first vendor ID information VID<1:8> and the second vendor ID information VID<9:16> based on the channel option signal CHOPT. The second selector 732 may receive the first vendor ID information VID<1:8>, the second vendor ID information VID<9:16>, and the channel option signal CHOPT. The second selector 732 may output, as a second vendor ID signal VID_DQ<9:16>, one of the first vendor ID information VID<1:8> and the second vendor ID information VID<9:16> based on the channel option signal CHOPT. The first vendor ID signal VID_DQ<1:8> and the second vendor ID signal VID_DQ<9:16> may be output through data pads. For example, the first vendor ID signal VID_DQ<1:8> may be outputted through first to eighth data pads DQ1 to DQ8 and the second vendor ID signal VID_DQ<9:16> may be outputted through ninth to sixteenth data pads DQ9 to DQ16.

The output of the first selector 731 may be inputted to a data buffer 741. The data buffer 741 may receive the first vendor ID signal VID_DQ<1:8> and the output control signal VIDEN. When the output control signal VIDEN is enabled, the data buffer 741 may buffer the first vendor ID signal VID_DQ<1:8> and may output the buffered first vendor ID signal VID_DQ<1:8> through the first to eighth data pads DQ1 to DQ8. The data buffer 742 may receive the second vendor ID signal VID_DQ<9:16> and the output control signal VIDEN. When the output control signal VIDEN is enabled, the data buffer 742 may buffer the second vendor ID signal VID_DQ<9:16> and may output the buffered second vendor ID signal VID_DQ<9:16> through the ninth to sixteenth data pads DQ9 to DQ16.

Referring to FIGS. 3 and 7, the vendor ID output circuit 700 included in the first die 302 may output the first vendor ID information VID<1:8> as the first vendor ID signal VID_DQ<1:8> and may output the second vendor ID information VID<9:16> as the second vendor ID signal VID_DQ<9:16>, based on the channel option signal CHOPT. The second die 303 as disposed may be rotated by substantially 180° with reference to the first die 302, the first data-related pads of the second die 303 may be coupled to the second data-related pads of the second channel and the second data-related pads of the second die 303 may be coupled to the first data-related pads of the second channel. Therefore, the vendor ID output circuit 700 included in the second die 303 may output the first vendor ID information VID<1:8> as the second vendor ID signal VID_DQ<9:16> and thus output the first vendor ID information VID<1:8> to the data pads (DQ8 to DQ1) 313 of the second channel through the data pads (DQ16 to DQ9) 332 of the second die 303. In a similar manner, the vendor ID output circuit 700 may output the second vendor ID information VID<9:16> as the first vendor ID signal VID_DQ<1:8> and thus output the second vendor ID information VID<9:16> to the data pads (DQ16 to DQ9) 314 of the second channel through the data pads (DQ8 to DQ1) 331 of the second die 303.

Figure 8:
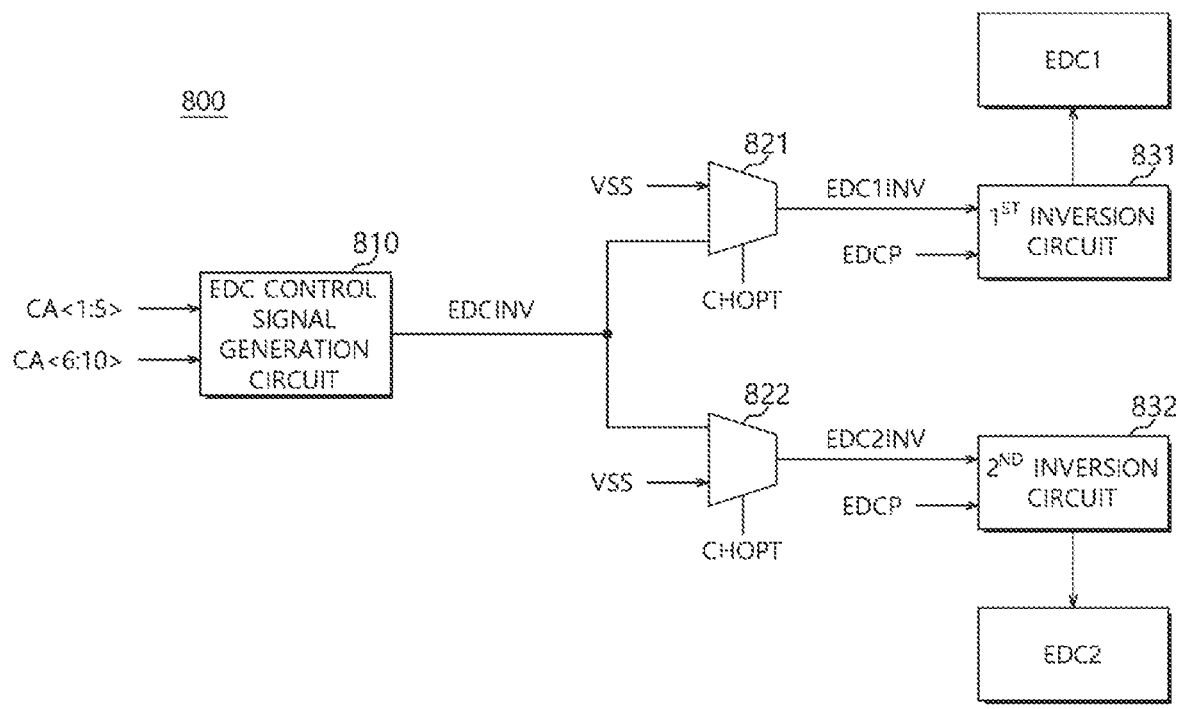
FIG. 8 shows a diagram illustrating a configuration of an error detection code (EDC) control circuit in accordance with an embodiment.

FIG. 8 shows a diagram illustrating a configuration of an error detection code (EDC) control circuit 800, in accordance with an embodiment. Referring to FIG. 2, each of the first die 202 and the second die 203 may include the EDC control circuit 800. The EDC control circuit 800 may be configured to output EDC patterns EDCP to the first EDC pad EDC1 and the second EDC pad EDC2 described with reference to FIG. 5. The EDC control circuit 800 may invert or non-invert the EDC patterns EDCP and output the inverted or non-inverted EDC patterns EDCP based on the command address signals CA<1:5> and CA<6:10>. The EDC control circuit 800 may include an EDC control signal generation circuit 810, a first selector 821, a second selector 822, a first EDC inversion circuit 831, and a second EDC inversion circuit 832. The EDC control signal generation circuit 810 may generate an EDC inversion control signal EDCINV based on the command address signals CA<1:5> and CA<6:10>. The EDC inversion control signal EDCINV may be used as an inversion flag indicating whether to invert the EDC patterns EDCP. The first selector 821 may receive the EDC inversion control signal EDCINV, a disable voltage VSS, and the channel option signal CHOPT. The first selector 821 may output, as a first EDC inversion control signal EDCINV, one of the EDC inversion control signal EDCINV and the disable voltage VSS based on the channel option signal CHOPT. The disable voltage VSS may have a voltage level that can disable the first EDC inversion control signal EDC1INV and, for example, may have a voltage level corresponding to the ground voltage. The second selector 822 may receive the EDC inversion control signal EDCINV, the disable voltage VSS, and the channel option signal CHOPT. The second selector 822 may output, as a second EDC inversion control signal EDC2INV, one of the EDC inversion control signal EDCINV and the disable voltage VSS based on the channel option signal CHOPT.

The first EDC inversion circuit 831 may receive the EDC patterns EDCP and the first EDC inversion control signal EDC1INV. The first EDC inversion circuit 831 may output inverted EDC patterns by inverting the EDC patterns EDCP when the first EDC inversion control signal EDC1INV is enabled, and may output non-inverted EDC patterns by non-inverting the EDC patterns EDCP when the first EDC inversion control signal EDC1INV is disabled. The output of the first EDC inversion circuit 831 may be output through the first EDC pad EDC1. The second EDC inversion circuit 832 may receive the EDC patterns EDCP and the second EDC inversion control signal EDC2INV. The second EDC inversion circuit 832 may output inverted EDC patterns by inverting the EDC patterns EDCP when the second EDC inversion control signal EDC2INV is enabled, and may output non-inverted EDC patterns by not inverting the EDC patterns EDCP when the second EDC inversion control signal EDC2INV is disabled. The output of the second EDC inversion circuit 832 may be output through the second EDC pad EDC2.

Referring to FIGS. 5 and 8, the first EDC pad EDC1 of the first die 502 may be coupled to the first EDC pad EDC1 of the first channel, and the second EDC pad EDC2 of the first die 502 may be coupled to the second EDC pad EDC2 of the first channel. Therefore, the levels of the first EDC inversion control signal EDC1INV and the second EDC inversion control signal EDC2INV might not be changed. Because the second die 503 as disposed is rotated by substantially 180° with reference to the first die 502, the first EDC pad EDC1 of the second die 503 may be coupled to the second EDC pad EDC2 of the second channel, and the second EDC pad EDC2 of the second die 503 may be coupled to the first EDC pad EDC1 of the second channel. Therefore, the EDC control circuit 700 disposed within the second die 503 may precisely invert and output the EDC patterns EDCP, which is require the inversion, by swapping and outputting the levels of the first EDC inversion control signal EDC1INV and the second EDC inversion control signal EDC2INV based on the channel option signal CHOPT.

Figure 9:
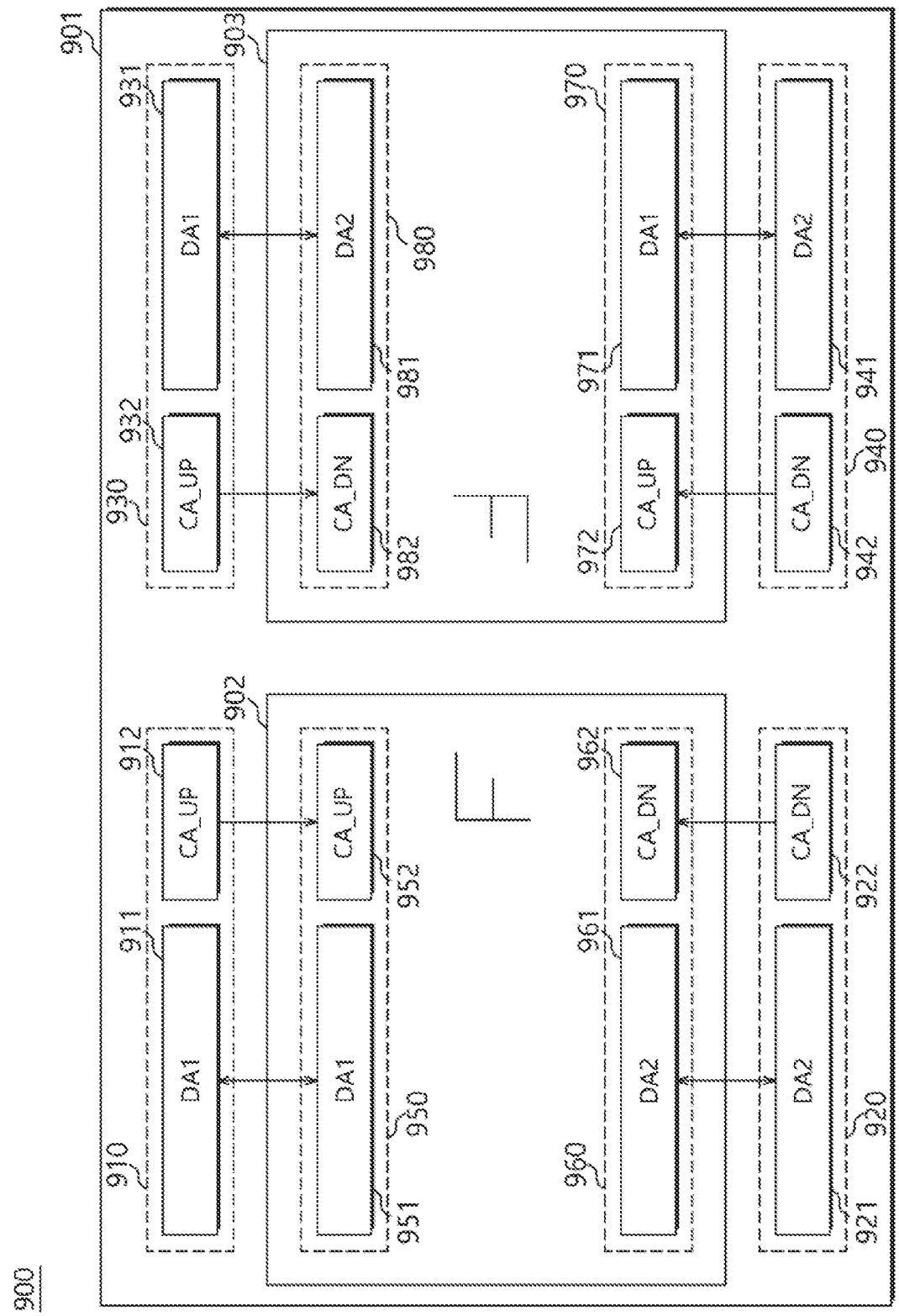
FIG. 9 shows a diagram illustrating a configuration of a semiconductor apparatus, in accordance with an embodiment.

FIG. 9 shows a diagram illustrating a configuration of a semiconductor apparatus 900 in accordance with an embodiment. The semiconductor apparatus 900 may have substantially the same configuration as the semiconductor apparatus 200 described with reference to FIG. 2. Descriptions for similar elements between the semiconductor apparatuses 200 and 900 will be omitted here for brevity. Referring to FIG. 9, the substrate 901 may include first byte pads 910 of the first channel, second byte pads 920 of the first channel, first byte pads 930 of the second channel, and second byte pads 940 of the second channel. The first byte pads 910 of the first channel may include first data-related pads 911 and a first command address pad 912. The second byte pads 920 of the first channel may include second data-related pads 921 and a second command address pad 922. The first byte pads 930 of the second channel may include first data-related pads 931 and a first command address pad 932. The second byte pads 940 of the second channel may include second data-related pads 941 and a second command address pad 942. The first die 902 may include first byte pads 950 of the first die 902 and second byte pads 960 of the first die 902. The first byte pads 950 of the first die 902 may include first data-related pads 951 and a first command address pad 952. The second byte pads 960 of the first die 902 may include second data-related pads 961 and a second command address pad 962. The second die 903 may include first byte pads 970 of the second die 903 and second byte pads 980 of the second die 903. The first byte pads 970 of the second die 903 may include first data-related pads 971 and a first command address pad 972. The second byte pads 980 of the second die 903 may include second data-related pads 981 and a second command address pad 982.

The first data-related pads 951 of the first die 902 may be coupled to the first data-related pads 911 of the first channel, and the first command address pad 952 of the first die 902 may be coupled to the first command address pad 912 of the first channel. The second data-related pads 961 of the first die 902 may be coupled to the second data-related pads 921 of the first channel, and the second command address pad 962 of the first die 902 may be coupled to the second command address pad 922 of the first channel. The first data-related pads 971 of the second die 903 may be coupled to the second data-related pads 941 of the second channel, and the first command address pad 972 of the second die 903 may be coupled to the second command address pad 942 of the second channel. The second data-related pads 981 of the second die 903 may be coupled to the first data-related pads 931 of the second channel, and the second command address pad 982 of the second die 903 may be coupled to the first command address pad 932 of the second channel. The semiconductor apparatus 900 may be different from the semiconductor apparatus 200 described with reference to FIG. 2 in that the first command address pad 972 and the second command address pad 982 of the second die 903 are respectively coupled to the second command address pad 942 and the first command address pad 932 of the second channel. The semiconductor apparatus 900 may receive command address signals, which are transferred through the first command address pad 932 of the second channel, through the second command address pad 982 of the second die 903. The semiconductor apparatus 900 may receive command address signals, which are transferred through the second command address pad 942 of the second channel, through the first command address pad 972 of the second die 903.

The second die 903 may swap the command address signals received through the first command address pad 972 and the command address signals received through the second command address pad 982 and may use the swapped signals. The second die 903 may swap the command address signals received through the first command address pad 972 and the command address signals received through the second command address pad 982 based on the channel option signal CHOPT. The second die 903 may store therein the data received through the second data-related pads 981 or may output therefrom data to the second data-related pads 981 based on the command address signal received through the first command address pad 972. The second die 903 may store therein the data received through the first data-related pads 971 or may output therefrom data to the first data-related pads 971 based on the command address signal received through the second command address pad 982. The elements described with reference to FIGS. 3 to 8 may be implemented as elements within the semiconductor apparatus 900.

While certain embodiments have been described above, it will be understood to those skilled in the art that the embodiments represent only a limited number of possible embodiments. Accordingly, the semiconductor apparatus including a plurality of dies operating as a plurality of channels should not be limited based on the described embodiments. Rather, the semiconductor apparatus including a plurality of dies operating as a plurality of channels described herein should only be limited in light of the claims that follow when taken in conjunction with the above description and accompanying drawings.

What is claimed is:

1. A semiconductor apparatus comprising:
    a substrate comprising first byte pads of a first channel, second byte pads of the first channel, first byte pads of a second channel, second byte pads of the second channel;
    a first die disposed on the substrate; and
    a second die disposed on the substrate, wherein the second die as disposed on the substrate is rotated by substantially 180 degrees with respect to the first die as disposed on the substrate,
    wherein first byte pads of the second die are respectively coupled to the second byte pads of the second channel and second byte pads of the second die are respectively coupled to the first byte pads of the second channel,
    wherein the second die is configured to store data, which is received through the first byte pads of the second channel, based on a control signal received through the second byte pads of the second channel, and configured to store data, which is received through the second byte pads of the second channel, based on a control signal received through the first byte pads of the second channel.

2. The semiconductor apparatus of claim 1, wherein the first die is configured to store data, which is received through the first byte pads of the first channel, based on a control signal received through the first byte pads of the first channel, and configured to store data, which is received through the second byte pads of the first channel, based on a control signal received through the second byte pads of the first channel.

3. The semiconductor apparatus of claim 1, wherein the second die includes:
    a first byte memory bank coupled to the first byte pads of the second die and configured to at least one of receive and output data through the first byte pads of the second die; and
    a second byte memory bank coupled to the second byte pads of the second die and configured to at least one of receive and output data through the second byte pads of the second die.

4. A semiconductor apparatus comprising:
    a substrate comprising first byte pads of a first channel and first byte pads of a second channel disposed on a first side of the substrate and second byte pads of the first channel and second byte pads of the second channel disposed on a second side of the substrate opposite the first side of the substrate;
    a first die disposed on the substrate and comprising first byte pads of the first die disposed on one side of the first die which faces the first side of the substrate and second byte pads of the first die disposed on the other side of the first die which faces the second side of the substrate, wherein the first byte pads of the first die are respectively coupled to the first byte pads of the first channel, and wherein the second byte pads are respectively coupled to the second byte pads of the first channel;
    a second die disposed on the substrate and comprising first byte pads of the second die disposed on one side of the second die which faces the second side of the substrate and second byte pads of the second die disposed on the other side of the second die which faces the first side of the substrate, wherein the first byte pads of the second die are respectively coupled to the second byte pads of the second channel, and wherein the second byte pads of the second die are respectively coupled to the first byte pads of the second channel.

5. The semiconductor apparatus of claim 4,
wherein the first byte pads of the first channel include first data-related pads and first command address pads, which are sequentially disposed, and wherein the first byte pads of the second channel include first command address pads and first data-related pads, which are sequentially disposed,
wherein the second byte pads of the first channel include second data-related pads and second command address pads, which are sequentially disposed, and wherein the second byte pads of the second channel include second command address pads and second data-related pads, which are sequentially disposed,
wherein the first byte pads of the first die include first data-related pads and first command address pads, which are sequentially disposed, and wherein the second byte pads of the first die include second data-related pads and second command address pads, which are sequentially disposed, and
wherein the first byte pads of the second die include first data-related pads and first command address pads, which are sequentially disposed, and wherein the second byte pads of the second die include second data-related pads and second command address pads, which are sequentially disposed.

6. The semiconductor apparatus of claim 5,
wherein the first data-related pads of the first die are respectively coupled to the first data-related pads of the first channel,
wherein the first command address pads of the first die are respectively coupled to the first command address pads of the first channel,
wherein the second data-related pads of the first die are respectively coupled to the second data-related pads of the first channel, and
wherein the second command address pads of the first die are respectively coupled to the second command address pad of the first channel.

7. The semiconductor apparatus of claim 6,
wherein the first die further comprises a first byte memory bank and a second byte memory bank,
wherein the first die is configured to at least one of store data, which is received through the first data-related pads of the first die into the first byte memory bank and output data, which is output from the first byte memory bank through the first data-related pads of the first die, and
wherein the first die is further configured to at least one of store data, which is received through the second data-related pads of the first die into the second byte memory bank and output data, which is output from the second byte memory bank through the second data-related pads of the first die.

8. The semiconductor apparatus of claim 5,
wherein the first data-related pads of the second die are respectively coupled to the second data-related pads of the second channel,
wherein the first command address pads of the second die are respectively coupled to the first command address pad of the second channel,
wherein the second data-related pads of the second die are respectively coupled to the first data-related pads of the second channel, and
wherein the second command address pads of the second die are respectively coupled to the second command address pads of the second channel.

9. The semiconductor apparatus of claim 8,
wherein the second die further comprises a first byte memory bank and a second byte memory bank,
wherein the second die is configured to at least one of store data, which is received through the first data-related pads of the second die into the first byte memory bank and output data, which is output from the first byte memory bank through the first data-related pads of the second die, and
wherein the second die is further configured to at least one of store data, which is received through the second data-related pads of the second die into the second byte memory bank and output data, which is output from the second byte memory bank through the second data-related pads of the second die.

10. The semiconductor apparatus of claim 5,
wherein the first data-related pads of the second die are respectively coupled to the second data-related pads of the second channel,
wherein the first command address pads of the second die are respectively coupled to the second command address pads of the second channel,
wherein the second data-related pads of the second die are respectively coupled to the first data-related pads of the second channel, and
wherein the second command address pads of the second die are respectively coupled to the first command address pads of the second channel.

11. The semiconductor apparatus of claim 10,
wherein the second die further comprises a first byte memory bank and a second byte memory bank,
wherein the second die is configured to at least one of store data, which is received through the second data-related pads of the second die into the first byte memory bank and output data, which is output from the first byte memory bank through the first data-related pads of the second die, based on command address signals received through the first command address pads of the second die, and
wherein the second die is further configured to at least one of store data, which is received through the first data-related pads of the second die into the second byte memory bank and output data, which is output from the second byte memory bank through the second data-related pads of the second die, based on command address signals received through the second command address pads of the second die.

* * * * *